United States Patent
Ramaraju et al.

(10) Patent No.: US 7,548,103 B2
(45) Date of Patent: Jun. 16, 2009

(54) STORAGE DEVICE HAVING LOW POWER MODE AND METHODS THEREOF

(75) Inventors: Ravindraraj Ramaraju, Round Rock, TX (US); David R. Bearden, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/553,022

(22) Filed: Oct. 26, 2006

(65) Prior Publication Data

US 2008/0100363 A1 May 1, 2008

(51) Int. Cl.
*H03K 3/00* (2006.01)
(52) U.S. Cl. .................. 327/218; 327/200; 327/202; 327/203
(58) Field of Classification Search ............ 327/218, 327/202
See application file for complete search history.

(56) References Cited

U.S. PATENT DOCUMENTS

| | | | |
|---|---|---|---|
| 6,404,254 B2 | 6/2002 | Iwaki et al. | |
| 6,504,412 B1 * | 1/2003 | Vangal et al. | 327/203 |
| 6,597,620 B1 | 7/2003 | McMinn | |
| 7,170,327 B2 * | 1/2007 | Aksamit | 327/202 |
| 7,183,825 B2 * | 2/2007 | Padhye et al. | 327/202 |
| 2003/0188241 A1 | 10/2003 | Zyuban et al. | |
| 2004/0061135 A1 | 4/2004 | Ikeno et al. | |
| 2004/0143769 A1 | 7/2004 | Deng et al. | |
| 2006/0006900 A1 | 1/2006 | Kinkade et al. | |
| 2006/0192596 A1 | 8/2006 | Ramaraju et al. | |
| 2006/0192604 A1 | 8/2006 | Ramaraju et al. | |

* cited by examiner

Primary Examiner—Kenneth B Wells
Assistant Examiner—John W Poos

(57) ABSTRACT

A storage device and methods thereof are disclosed. The device includes a clock control module and a latch. During normal operation, the clock control module provides a periodic clock signal to a clock input of the latch, allowing the latch to operate normally. In a low power mode of operation, the clock control module provides a constant signal to the clock input of the latch so that the latch retains stored data during the low power mode of operation. The storage device can also include a power control module that provides a first power level to the latch in the normal mode of operation and a second power level during the second mode of operation.

20 Claims, 4 Drawing Sheets

US 7,548,103 B2

STORAGE DEVICE HAVING LOW POWER MODE AND METHODS THEREOF

FIELD OF THE DISCLOSURE

The present disclosure is related to storage devices and methods.

BACKGROUND

Integrated circuits are being manufactured with increasingly more transistors. As the transistor count goes up, static leakage power (i.e. power consumption due to static current leakage) also increases. One way to reduce the static leakage power is to operate the integrated circuit at a lower supply voltage. Another way to reduce the static leakage power is to manufacture the transistors with relatively higher threshold voltages. However, both of these techniques can lower the operating speed of the integrated circuits.

Some integrated circuits are designed having a lower power mode, such as an idle mode, of operation as compared to a normal operating mode to reduce static power consumption during times of little or no activity. It is sometimes desirable during low power operation to retain the logic state of certain storage elements so that the integrated circuit can return to a normal operating mode without loss of the information stored at the storage elements. One technique used to retain information is to store the information in a separate memory array before entering the low power mode and to provide sufficient power to the separate memory array during the low power mode to maintain the stored information. However, the memory array can be undesirably large and complex as the amount of information to be retained becomes large. Therefore, an improved storage device would desirable.

DETAILED DESCRIPTION

A storage device and methods thereof are disclosed. The device includes a clock control module and a latch. During normal operation, the clock control module provides a periodic clock signal to a clock input of the latch, allowing the latch to operate normally. In a low power mode of operation, the clock control module provides a constant signal to the clock input of the latch so that the latch retains stored data during the low power mode of operation. The storage device can also include a power control module that provides a first power level to the latch in the normal mode of operation and a second power level during the low power mode of operation.

Figure 1:
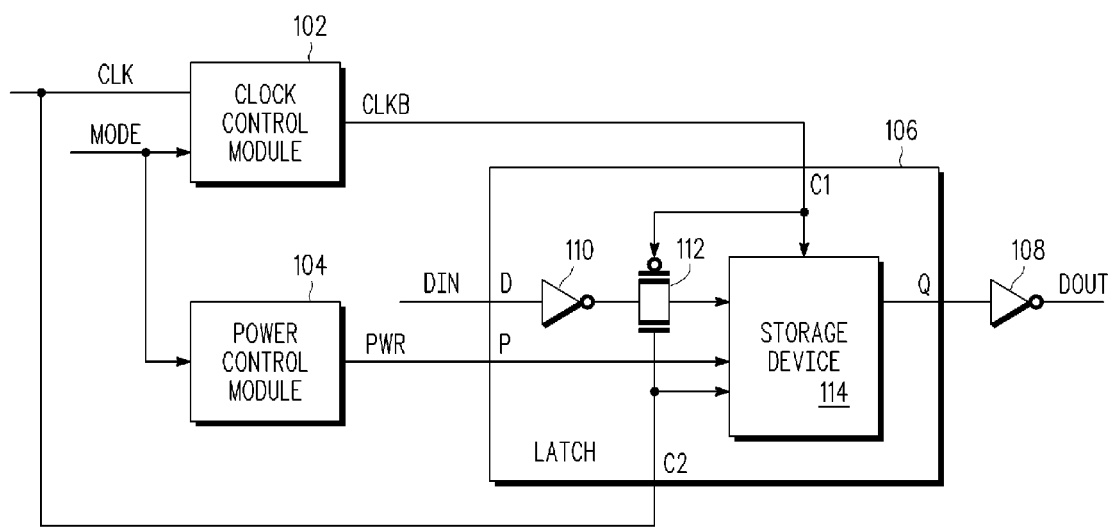
FIG. 1 is a combined block and circuit diagram of a particular embodiment of a storage device.

Referring to FIG. 1, a device 100 is illustrated. The device includes a clock control module 102, a power control module 104, a latch 106, and an inverter 108. The clock control module 102 includes a clock input to receive a signal (CLK), a control input to receive a control signal (MODE), and an output to provide a signal (CLKB). The power control module 104 includes a control input to receive the MODE signal and an output to provide a voltage level (PWR) to power the device 100. The latch 106 includes a data input (D) to receive a data signal (DIN), power input (P) to receive the voltage level PWR, a first clock input (C1) to receive the signal CLKB, a second clock input (C2) to receive the signal CLK, and a data output (Q). The inverter 108 includes an input connected to the data output of the latch 106 and an output to provide a signal DOUT.

During operation, the device 100 can operate in two modes. In a normal mode of operation, the latch 106 latches data present at the D input during the transition of a periodic clock signal provided at the C1 and C2 clock inputs. The latched data is provided at the output Q and inverted by the inverter 108 to provide the signal DOUT. The signal DOUT can be used to control other modules of the device 100. During the normal mode of operation, the signal DOUT is used by other modules (not shown) of the device 100 for normal operation of the device.

The device 100 can also operate in a low power mode of operation. In this mode, other modules of the device 100 can operate at reduced functionality, or cease functioning altogether. For example, the low power mode may be a sleep mode, where one or more modules cease functioning in order to conserve battery power. In this low power mode of operation, the latch 106 does not store data present at the input DIN, but instead maintains the data that was stored at the latch 106 when the device 100 entered the low power mode. Because the stored data is maintained at the latch 106 during the low power mode, the data is available when the device 100 returns to normal mode. Accordingly, use of the latch 106 permits the device 100 to enter the low power mode without losing critical data, thereby allowing normal operation to be resumed using information stored prior to entering the low power mode.

The mode of operation of the device 100 depends on the state of the MODE control signal. When the MODE control signal is in a state indicating a normal mode of operation, the clock signal CLK is a periodic clock signal, and the clock input of the clock control module 102 is coupled to the clock output to provide the signal CLKB as an inverted representation of the periodic clock signal CLK. In addition, in the normal mode of operation the power control module 104 provides a normal operating voltage for the PWR power signal. Accordingly, in the normal mode of operation, the latch 106 latches data present at the input D during a transition of the periodic clock signal and provides a signal representing the latched data at the output Q. The inverter 108 inverts the signal to provide the signal DOUT.

When the mode control signal indicates a low power mode of operation, the clock input of the clock control module 102 is decoupled from the clock input, and the clock control module 102 provides a constant signal level for the CLKB signal. In this mode of operation, the latch 106 uses the constant signal level of the CLKB signal to retain the state of the data latched prior to entering the low power mode. In addition, in the low power mode, the power control module provides a low voltage, relative to the voltage provided in the normal mode of operation, for the PWR signal. The constant signal level at the clock input C1 of the latch 106, as well as the voltage provided by the PWR signal, allows the latch 106 to retain the state of data stored when the device 100 enters the low power mode. In a particular embodiment, the constant signal level is above a ground voltage level. The latch 106 is able to retain the stored data without using additional transistors or other components, such as a shadow latch. Accordingly, the clock control module 102 and the power control module 104 can be implemented with simple latch designs to give the latch data retention functionality. Further, due to the reduced power provided by the PWR signal, and the constant signal provided at the clock input C1, the amount of static power leakage for the latch 106 is reduced.

The latch 106 includes an inverter 110, a pass gate 112, and a storage element 114. The inverter 110 includes an input connected to the data input D and an output. The pass gate 112 includes a data input connected to the output of the inverter 110, a data output, a control input connected to the clock input C1, and a control input connected to the clock input C2. The pass gate 112 can include two transistors of opposite polarities to operate the pass gate. The storage element 114 includes a data input connected to the data output of the pass gate 112, a power input connected to the power input P of the latch 106, a clock input connected to the clock input C1, a clock input connected to the clock input C2, and a data output connected to the data output Q of the latch 106.

In the normal mode of operation, the complementary periodic clock signals provided as the signals CLK and CLKB control the pass gate 112 to periodically update at the storage element 114. The storage element 114 periodically stores the provided data based on the signals CLK and CLKB. A representation of the stored data is provided at the output Q. In addition, in the normal operating mode, the power control module 104 provides a normal power level to the storage element 114 via the power input P. This normal power level allows the components of the storage element 114 to operate at a normal operating speed, so that data is latched at the latch 106 at the appropriate rate for normal operation of the device 100.

In the low power mode of operation, the signal CLK is at a low voltage level (e.g., ground), while the signal CLKB is at a constant voltage level sufficiently high to allow the storage element 114 to retain data stored prior to entering the low power mode, while ensuring that the pass gate 112 remains in a non-conductive state, thereby reducing static power leakage in the latch 106. Further, the PWR signal is set to a lower voltage level in the low power mode of operation. This lower voltage level allows the storage element 114 to retain the stored data, while operating at a lower power level to reduce power consumption. In a particular embodiment, the signal CLK is not actively maintained, but is allowed to reach a ground state by reducing power to the module (not shown) that generates the signal. In another particular embodiment the signal CLK is actively maintained at the low voltage level.

Figure 2:
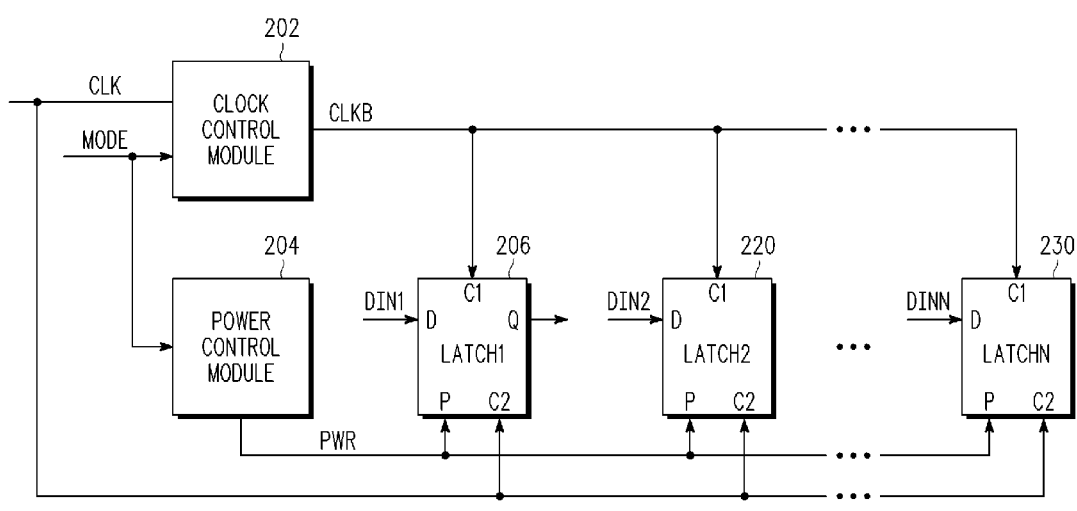
FIG. 2 is a block diagram of a particular embodiment of a storage device using a plurality of latches.

Referring to FIG. 2, a block diagram of a particular embodiment of a device 200 is illustrated. The device 200 includes a clock control module 202, a power control module 204, and latches 206, 220, and additional latches through latch 230 (latches 206-230). The clock control module 202 includes a clock input to receive a signal (CLK), a control input to receive a control signal (MODE), and an output to provide a signal (CLKB). The power control module 204 includes a control input to receive the MODE signal and an output to provide a voltage level (PWR). Each of the latches 206 includes a data input (D) to receive a data signal, power input (P) coupled to the power control module 204 to receive the voltage level PWR, a first clock input (C1) to receive the signal CLKB, a second clock input (C2) to receive the signal CLK, and a data output (Q).

During operation, the device 200 operates in two different modes, with the mode of operation controlled by the MODE control signal. When the MODE control signal is in a state indicating that the device 200 is in a normal mode of operation, the clock signal CLK is provided as a periodic clock signal, and the clock control module 202 provides the signal CLKB as an inverted representation of the periodic clock signal CLK. In addition, in the normal mode of operation the power control module 204 provides a normal operating voltage for the PWR power signal. Accordingly, in the normal mode of operation, based on the signals CLK and CLKB the latches 206-230 latches data provided at the input D and provides a signal representing the latched data at the output Q.

When the mode control signal indicates a low power mode of operation, the clock control module 202 provides a constant signal level for the CLKB signal. In addition, in the low power mode, the power control module 204 provides a low voltage, relative to the voltage provided in the normal mode of operation, for the PWR signal. In this mode of operation, the latches 206-230 use the constant signal level of the CLKB signal to retain the state of the data latched prior to entering the low power mode. Accordingly, a single clock control module 202 and a single power control module 204 can be used by multiple latches to retain latched data in a low power mode. Further, in some embodiments the latches themselves do not use additional transistors or other components to retain the latched data. Thus, the amount of circuitry used to retain latched data at a bank of latches is relatively small compared to using a shadow latch for each of the latches 206-230.

Figure 3:
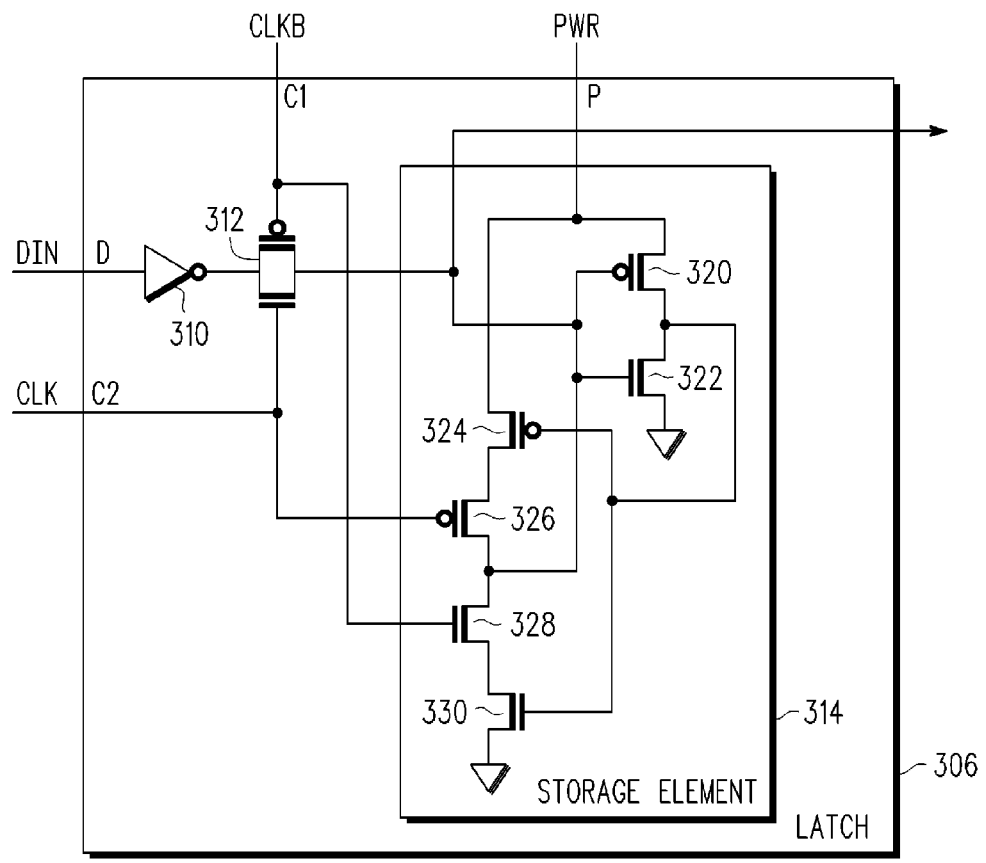
FIG. 3 is a circuit diagram of a particular embodiment of the latch of FIG. 1.

Referring to FIG. 3, a particular embodiment of a latch 306, corresponding to the latch 106 of FIG. 1, is illustrated. The latch 306 includes a data input (D) to receive a data signal DIN, a clock input (C1) to receive a signal CLKB, a second clock input (C2) to receive a signal CLK, and a power input (P) to receive a voltage level PWR. The latch 306 further includes an inverter 310, a pass gate 312, and a storage element 314. The inverter 310 includes an input connected to the data input D and an output. The pass gate 312 includes a data input connected to the output of the inverter 310, a data output, a control input connected to the clock input C1, and a control input connected to the clock input C2.

The storage element 314 includes p-type transistors 320, 324, and 326, and n-type transistors 322, 328, and 330 (transistors 320-330). The transistor 320 includes a first current electrode connected to the power input P, a second current electrode, and a control electrode connected to the data output of the pass gate 312. The transistor 322 includes a first current electrode connected to the second current electrode of the transistor 320, a second current electrode connected to a ground voltage reference, and a control electrode connected to the data output of the pass gate 312. The transistor 324 includes a first current electrode connected to the power input P, a second current electrode, and a control electrode connected to the second current electrode of the transistor 320.

The transistor 326 includes a first current electrode connected to the second current electrode of the transistor 324, a second current electrode connected to the data output of the pass gate 312, and a control electrode connected to the clock input C2. The transistor 328 includes a first current electrode connected to the data output of the pass gate 312, a second current electrode, and a control electrode connected to the clock input C1. The transistor 330 includes a first current electrode connected to the second current electrode of the transistor 328, a second current electrode connected to the ground voltage reference, and a control electrode connected to the second current electrode of the transistor 320.

During the normal mode of operation, the configuration of the transistors 320-330 operates to store data present at the input D based on the clock signals provided at the inputs C1 and C2. The transistors 320 and 322 invert the data present at the input of the storage element 314. The inverted data is inverted by the transistors 324 and 330, and provided to the transistors 320 and 322. Accordingly, the cross-coupled inverters formed by the transistors 320, 322, 324 and 330 store the data present at the input D. Further, a normal operating voltage is provided at the power input P to allow the transistors 320-330 to operate at a nominal switching speed. In the low power mode of operation, a lower operating voltage is provided at the power input P, while a constant signal level is provided at the input C1. Accordingly, the configuration of the transistors 320-330 operate to retain the data latched prior to entering the low power mode.

Figure 4:
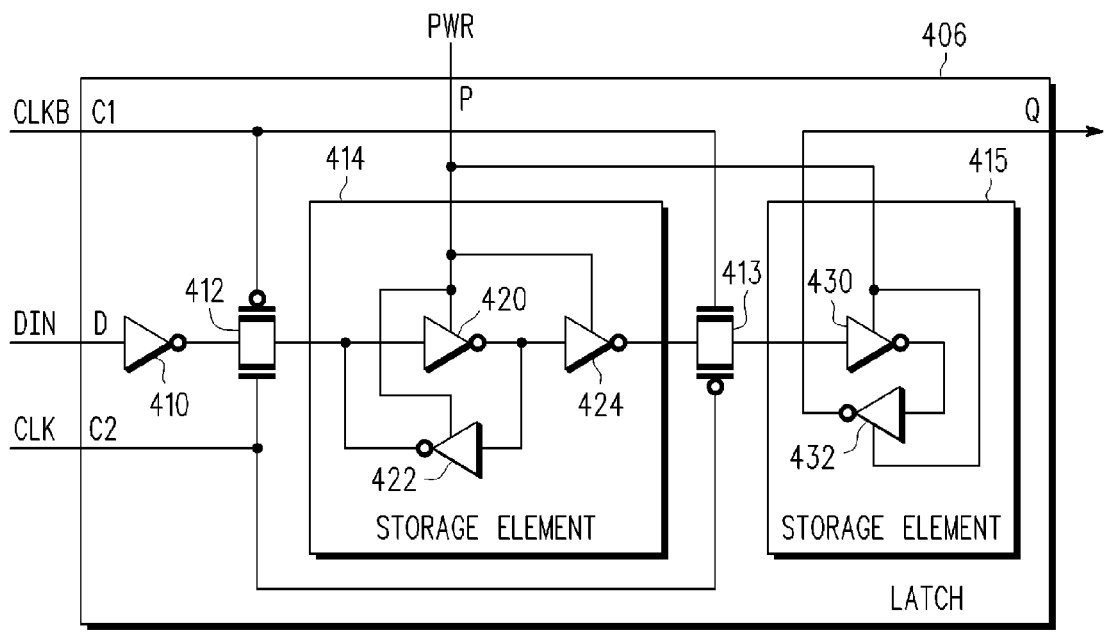
FIG. 4 is a circuit diagram of an alternative particular embodiment of the latch of FIG. 1.

Referring to FIG. 4, a particular embodiment of a latch 406 that may be used in place of the latch 106 of FIG. 1 is illustrated. The latch 402 includes an inverter 410, storage elements 414 and 415, and pass gates 412 and 413. The inverter 410 includes an input connected to a data input (D) of the latch to receive a signal DIN and an output. The pass gate 412 includes a data input connected to the output of the inverter 410, a data output, a control input connected to a first clock input (C1) of the latch to receive a signal CLKB, and a control input connected to a second clock input (C2) of the latch to receive a signal CLK. The storage element 414 includes a data input connected to the data output of the pass gate 412, a data output, and a power input connected to the power input (P) of the latch 406 to receive a power signal PWR.

The pass gate 413 includes a data input connected to the output of the storage element 414, a data output, a control input connected to the clock input C1 of the latch to receive a signal CLKB, an control input connected to the input C2 of the latch to receive a signal CLK. The storage element 415 includes a data input connected to the data output of the pass gate 413, a data output connected to the data output (Q) of the latch 406, and a power input connected to the power input (P) of the latch 406 to receive the power signal PWR.

During operation, the latch 406 is configured as a master-slave latch. In the normal mode of operation the storage element 414 is configured as the master portion of the latch 406 and stores an inverted representation of data present at the input D, provided via the pass gate 412, at each falling edge of the clock signal at the clock input C2. The storage element 415 is configured as the slave portion of the latch 406, and stores the data provided at the output of the storage element 414 at each falling edge of the clock signal provided at the clock input C1.

In the low power mode of operation, the storage elements 414 and 415 are each provided a lower power level via the power input P. The lower power level is sufficient for the storage elements 414 and 415 to retain data stored in each element when the low power mode is entered. In addition, in the low power mode the pass gate 412 is maintained in a non-conductive state due to the constant signal provided at the clock input C1, thereby reducing the static leakage power of the latch 406.

The storage element 414 includes inverters 420, 422, and 424. The inverter 420 includes a data input connected to the data output of the pass gate 412, a data output, and a power input connected to the power input P of the latch 406. The inverter 422 includes a data input connected to the data output of the inverter 420, a data output connected to the data input of the inverter 420, and a power input connected to the power input P of the latch 406. The inverter 424 includes a data input connected to the data output of the inverter 420, a data output connected to the data input of the pass gate 413 and a power input connected to the power input P of the latch 406.

The storage element 415 includes inverters 430 and 432. The inverter 430 includes a data input connected to the data output of the pass gate 413, a data output, and a power input connected to the power input P of the latch 406. The inverter 432 includes a data input connected to the data output of the inverter 430, a data output connected to the data input of the inverter 430, and a power input connected to the power input P of the latch 406.

In the normal mode of operation, the configuration of the inverters 420 and 422 store data provided via the pass gate 412, while the configuration of the inverters 430 and 432 store data provided via the pass gate 413. In the normal mode, a normal operating voltage is provided at the power input P of the latch 406, so that the inverters 420, 422, 430, and 432 operate at a nominal switching speed. In the low power mode of operation, the voltage provided at the power input P is reduced. Accordingly, the inverters 420, 422, 430, and 432 operate at a slower switching speed, but are able to maintain the data stored at the storage elements 414 and 415 when the low power mode was entered. In a particular embodiment, in the low power mode the signal CLKB is maintained at a constant level so that the pass gate 412 is kept in a non-conductive state. This allows the storage element 414 to maintain the stored data while reducing leakage current. In this embodiment, the pass gate 413 is maintained in a conductive state, so that the data in the storage element 414 is flushed to the storage element 415 and maintained.

It will be appreciated that the master and slave portions of the latch 406 are illustrated as having common power and clock signals for purposes of discussion, and that other configurations are possible. For example, power may be independently provided to the storage elements 414 and 415. Similarly, separate and independent clock signals can be provided to the pass gates 412 and 413. In such a configuration, different data values may be maintained at the storage elements 414 and 415 in the low power mode. In an alternative embodiment, in the low power mode data may be maintained at one of the storage elements 414 and 415 while the other is powered down.

Figure 5:
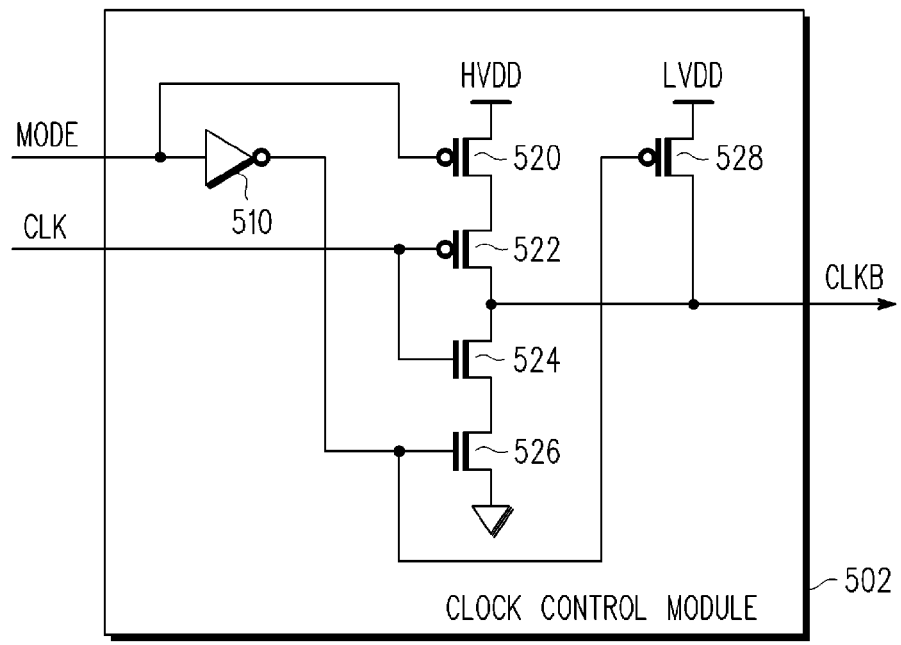
FIG. 5 is a circuit diagram of a particular embodiment of the clock control module of FIG. 1.

Referring to FIG. 5, a circuit diagram of a particular embodiment of a clock control module 502, corresponding to the clock control module 102 of FIG. 1, is illustrated. The clock control module 502 includes an inverter 510, p-type transistors 520, 522, and 528, and n-type transistors 524 and 526. The inverter 510 includes an input to receive the control signal MODE and an output.

The transistor 520 includes a first current electrode connected to a voltage reference HVDD, a second current electrode, and a control electrode to receive the MODE control signal. The transistor 522 includes first current electrode connected to the second current electrode of the transistor 520, a second current electrode to provide the signal CLKB, and a control electrode to receive a signal CLK. The transistor 524 includes a first current electrode connected to the second current electrode of the transistor 522, a second current electrode, and a control electrode to receive the CLK signal. The transistor 526 includes a first current electrode connected to the second current electrode of the transistor 524, a second current electrode connected to a ground voltage reference, and a control electrode connected to the output of the inverter 510. The transistor 528 includes a includes a first current electrode connected to a voltage reference LVDD, a second current electrode connected to the second current electrode of the transistor 522, and a control electrode connected to the output of the inverter 510.

During operation, the MODE control signal determines the signal CLKB provided at the output of the clock control module 502. When the MODE control signal indicates a normal mode of operation by being in a logic low state, the transistors 520 and 526 are placed in conductive states. Accordingly, in this mode the transistors 522 and 524 are configured to invert the clock signal CLK and the CLKB represents an inverted representation of the signal CLK. In the low power mode, the MODE control signal is in a logic high state and the transistors 520 and 526 are placed in a non-conductive state while the transistor 528 is placed in a conductive state. Accordingly, in the low power mode of operation a constant signal level, near the level of the voltage reference LVDD, is provided via the signal CLKB. It will be appreciated that the inverter 510 remains powered in the low power mode of operation.

Figure 6:
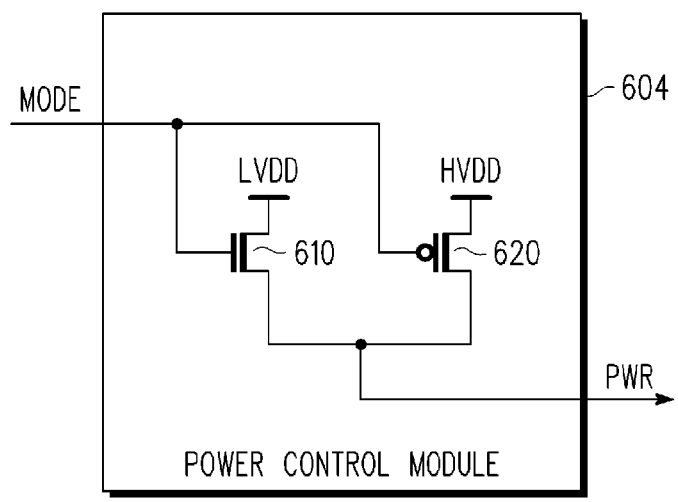
FIG. 6 is a circuit diagram of a particular embodiment of the power control module of FIG. 1.

Referring to FIG. 6, a circuit diagram of a particular embodiment of a power control module 604, corresponding to the power control module 104 of FIG. 1, is illustrated. The power control module 604 includes n-type transistor 610 and p-type transistor 620. The transistor 610 includes a first current electrode coupled to the voltage reference LVDD, a second current electrode to provide the output signal PWR, and a control electrode to receive the control signal MODE. The transistor 620 includes a first current electrode coupled to the voltage reference HVDD, a second current electrode coupled to the second current electrode of the transistor 610, and a control electrode to receive the control signal MODE.

In the normal mode of operation, the MODE control signal is at a logic low level. Accordingly, the transistor 610 is in a non-conductive state and the transistor 620 is in a conductive state. Therefore, in the normal mode of operation the voltage at the voltage reference HVDD is provided via the PWR signal. In the low power mode of operation, the MODE control signal is at a logic high level, thereby placing the transistor 610 in a conductive state and the transistor 620 in a non-conductive state. Accordingly, in the low power mode the relatively lower voltage of the voltage reference LVDD is provided via the PWR signal.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the scope of the disclosure. For example, although the embodiments disclosed herein have referred to certain transistors as having a particular polarity, it will be appreciated that transistors of other polarities may also be employed. It will further be appreciated that, although some circuit elements are depicted and described as connected to other circuit elements, the illustrated elements may also be coupled via additional circuit elements, such as resistors, capacitors, transistors, and the like.

What is claimed is:

1. A device, comprising:
    a power control module comprising a control input to receive a mode control signal and an output, the power control module configured to provide a first voltage reference at the output in response to the mode control signal being in a first state and to provide a second voltage reference at the output in response to the mode control signal being in a second state;
    a clock control module comprising a control input to receive the mode control signal, a first clock input, and a first output, the first output configured to provide a clock signal when the mode control signal is in the first state and configured to provide a constant signal level at the first output in response to the mode control signal being in the second state; and
    a first latch comprising:
        a first pass gate comprising a first control input coupled to the first output of the clock control module and a first output; and
        a first storage element comprising a first data input coupled to the first output of the first pass gate, a first clock input coupled to the first output of the clock control module, and a power input coupled to the output of the power control module.

2. The device of claim 1, wherein the second voltage reference is lower than the first voltage reference.

3. The device of claim 1, wherein the second voltage reference is at least equal to an operating voltage associated with the first storage element to allow the first storage element to maintain stored data.

4. The device of claim 1, wherein the first latch further comprises:
    a second storage element comprising a first data input and a power input coupled to the power output of the power control module; and
    a second pass gate comprising a first input coupled to the first output of the clock control module and a first output coupled to the first data input of the second storage element.

5. The device of claim 1 wherein the first pass gate further comprises a second input coupled to the first clock input of the clock control module.

6. The device of claim 5, wherein the first clock input is configured to provide a second periodic clock signal in response to the mode control signal being in the first state and is configured to provide a constant signal level in response to the mode control signal being in the second state.

7. The device of claim 1, wherein the clock control module further comprises:
    an inverter comprising an input coupled to the control input and an output;
    a first transistor comprising a first current electrode coupled to a first voltage reference, a second current electrode, and a gate electrode coupled to the control input;
    a second transistor comprising a first current electrode coupled to the second current electrode of the first transistor, a second current electrode coupled to the first output of the clock control module, and a control electrode coupled to the clock input;
    a third transistor comprising a first current electrode coupled to the second current electrode of the second transistor, a second current electrode, and a control electrode coupled to the clock input;
    a fourth transistor comprising a first current electrode coupled to the second current electrode of the third transistor, a second current electrode coupled to a second voltage reference, and a control electrode coupled to the output of the inverter; and
    a fifth transistor comprising a first current electrode coupled to third voltage reference, a second current electrode coupled to the first output of the clock control module, and a control electrode coupled to the output of the inverter.

8. The device of claim 1, wherein the power control module comprises:
    a first transistor comprising a first current electrode coupled to a first voltage reference, a second current electrode coupled to the output, and a control electrode coupled to the control input; and a second transistor comprising a first current electrode coupled to a second voltage reference, a second current electrode coupled to the output, and a control electrode coupled to the control input.

9. The device of claim 1, wherein the storage element further comprises:
   a second clock input;
   a first transistor comprising a first current electrode coupled to the power input, a second current electrode, and a control electrode coupled to the first data input;
   a second transistor comprising a first current electrode coupled to the second current electrode of the first transistor, a second current electrode coupled to a first voltage reference, and a control electrode coupled to the first data input;
   a third transistor comprising a first current electrode coupled to the power input, a second current electrode, and a control electrode coupled to the second current electrode of the first transistor;
   a fourth transistor comprising a first current electrode couple to the second current electrode of the third transistor, a second current electrode coupled to the data input, and a control electrode coupled to the second clock input;
   a fifth transistor comprising a first current electrode coupled to the data input, a second current electrode, and a control electrode coupled to the first clock input; and
   a sixth transistor comprising a first current electrode coupled to the second current electrode of the fifth transistor, a second current electrode coupled to the first voltage reference, and a control electrode coupled to the second current electrode of the first transistor.

10. The device of claim 1, further comprising:
    a second latch comprising a first clock input coupled to the first output of the clock control module, and a power input coupled to the output of the power control module.

11. The device of claim 1, wherein the constant signal level is based on the second voltage reference.

12. A method, comprising:
    in a first mode of operation, latching data at a first storage element;
    during the first mode of operation, providing a first periodic clock signal to a first clock input of the storage element;
    in a second mode of operation, maintaining the data latched at the first storage element; and
    during the second mode of operation, providing a fixed signal level to the first clock input of the first storage element.

13. The method of claim 12, further comprising:
    during the first mode of operation, providing a first voltage to a power input of the first storage element; and
    during the second mode of operation, providing a second voltage at the power input of the first storage element.

14. The method of claim 12, wherein the fixed signal level corresponds to the second voltage.

15. The method of claim 14, further comprising:
    in the first mode of operation, latching data at a plurality of storage elements;
    during the first mode of operation, providing a first periodic clock signal to a first clock input of the each of the plurality of storage elements;
    during the first mode of operation, providing a first voltage to a power input of each of the plurality of storage elements;
    in a second mode of operation, maintaining the data latched at each of the plurality of storage elements;
    during the second mode of operation, providing a fixed signal level to the first clock input of each of the plurality of storage elements; and
    during the second mode of operation, providing a second voltage at the power input of each of the plurality of storage elements.

16. The method of claim 14, further comprising:
    during the first mode of operation, providing a second periodic clock signal at a second clock input of the first storage element;
    during the second mode of operation, providing a second fixed signal at the second clock input of the first storage element.

17. The method of claim 12, wherein the second mode of operation corresponds to a low power mode of operation.

18. A device, comprising:
    a power control module comprising a control input to receive a mode control signal and an output, the power control module configured to provide a first voltage reference at the output in response to the mode control signal being in a first state and to provide a second voltage reference at the output in response to the mode control signal being in a second state;
    a clock control module comprising a control input to receive the mode control signal, a first clock input, and a first output, the first output configured to provide a clock signal when the mode control signal is in the first state and configured to provide a constant signal level at the first output in response to the mode control signal being in the second state, wherein the constant signal level is based on the second voltage reference;
    a first latch comprising:
      a first pass gate comprising a first control input coupled to the first output of the clock control module and a first output; and
      a first storage element comprising a first data input coupled to the first output of the first pass gate, a first clock input coupled to the first output of the clock control module, and a power input coupled to the output of the power control module.

19. The device of claim 18, wherein the clock control module further comprises:
    an inverter comprising an input coupled to the control input and an output;
    a first transistor comprising a first current electrode coupled to a first voltage reference, a second current electrode, and a gate electrode coupled to the control input;
    a second transistor comprising a first current electrode coupled to the second current electrode of the first transistor, a second current electrode coupled to the first output of the clock control module, and a control electrode coupled to the clock input;
    a third transistor comprising a first current electrode coupled to the second current electrode of the second transistor, a second current electrode, and a control electrode coupled to the clock input;
    a fourth transistor comprising a first current electrode coupled to the second current electrode of the third transistor, a second current electrode coupled to a second voltage reference, and a control electrode coupled to the output of the inverter; and
    a fifth transistor comprising a first current electrode coupled to third voltage reference, a second current electrode coupled to the first output of the clock control module, and a control electrode coupled to the output of the inverter.

20. The device of claim 18, wherein the power control module comprises:

a first transistor comprising a first current electrode coupled to a first voltage reference, a second current electrode coupled to the output, and a control electrode coupled to the control input; and a second transistor comprising a first current electrode coupled to a second voltage reference, a second current electrode coupled to the output, and a control electrode coupled to the control input.

* * * * *